(12) United States Patent
Steinhoff et al.

(10) Patent No.: US 7,639,463 B2
(45) Date of Patent: Dec. 29, 2009

(54) APPARATUS AND METHOD FOR REDUCING LEAKAGE BETWEEN AN INPUT TERMINAL AND POWER RAIL

(75) Inventors: Robert Michael Steinhoff, Dallas, TX (US); David John Baldwin, Allen, TX (US); Jonathan Scott Brodsky, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 457 days.

(21) Appl. No.: 11/257,839

(22) Filed: Oct. 25, 2005

(65) Prior Publication Data
US 2007/0091526 A1   Apr. 26, 2007

(51) Int. Cl.
*H02H 3/22* (2006.01)
(52) U.S. Cl. .......................................... 361/56; 361/111
(58) Field of Classification Search .................... 361/56, 361/111; 257/355–360
See application file for complete search history.

(56) References Cited

U.S. PATENT DOCUMENTS

| 4,048,584 | A | * | 9/1977 | Ulmer .......................... 331/62 |
| 4,068,278 | A | * | 1/1978 | Williams ....................... 361/56 |
| 5,563,757 | A |   | 10/1996 | Corsi |
| 5,973,897 | A | * | 10/1999 | Opris et al. ................... 361/56 |
| 6,639,772 | B2 | * | 10/2003 | Chuang et al. ................ 361/56 |
| 6,665,159 | B2 | * | 12/2003 | Takikawa et al. .............. 361/56 |
| 7,315,438 | B2 | * | 1/2008 | Hargrove et al. .............. 361/56 |
| 2002/0033504 | A1 | * | 3/2002 | Ohnakado .................... 257/350 |
| 2005/0017796 | A1 | * | 1/2005 | Tanizawa ..................... 327/562 |
| 2006/0109595 | A1 | * | 5/2006 | Watanabe et al. ............. 361/56 |
| 2008/0100973 | A1 | * | 5/2008 | Soldner et al. ................ 361/56 |
| 2009/0141413 | A1 | * | 6/2009 | Carroll et al. ................. 361/56 |

* cited by examiner

*Primary Examiner*—Danny Nguyen
(74) *Attorney, Agent, or Firm*—John J. Patti; Wade J. Brady, III; Frederick J. Telecky, Jr.

(57) ABSTRACT

An apparatus for reducing current leakage between an input locus and at least one power rail for a system includes, for each respective power rail: (a) A first diode unit coupled between the input locus and a coupling locus. The first diode unit is configured to effect substantially zero potential drop during normal operation of the apparatus. (b) A second diode unit coupled between the coupling locus and the respective power rail. The second diode unit is configured to present no forward bias during normal operation of the apparatus. The first and second diode units cooperate to effect current flow between the input locus and the respective power rail during a predetermined operational condition of the apparatus.

3 Claims, 4 Drawing Sheets

APPARATUS AND METHOD FOR REDUCING LEAKAGE BETWEEN AN INPUT TERMINAL AND POWER RAIL

BACKGROUND OF THE INVENTION

The present invention is directed to input circuitry, and especially to input circuitry operating to accommodate electrostatic discharge (ESD) conditions.

ESD cells or clamp units are designed to prevent voltage from building up at specific circuit loci, such as terminals. Electrical circuitry used with an ESD cell should limit or prevent electrical leakage at or through the specific terminals during normal operations, yet should support discharge of electrostatic charges from the specific terminals under the control of the ESD cell. It is difficult to ensure that only very little current is permitted to flow (i.e. leak) at or through the specific terminal during normal operating conditions.

There is a need for an apparatus and method for stringently limiting current leakage during normal operations while permitting current flow through a circuit locus, such as a terminal during an ESD condition.

SUMMARY OF THE INVENTION

An apparatus for reducing current leakage between an input locus and at least one power rail for a system includes, for each respective power rail: (a) A first diode unit coupled between the input locus and a coupling locus. The first diode unit is configured to effect substantially zero potential drop during normal operation of the apparatus. (b) A second diode unit coupled between the coupling locus and the respective power rail. The second diode unit is configured to present no forward bias during normal operation of the apparatus. The first and second diode units cooperate to effect current flow between the input locus and the respective power rail during a predetermined operational condition of the apparatus.

A method for reducing current leakage between an input locus and at least one power rail for a system includes, for each respective power rail, the steps of: (a) In no particular order: (1) providing a first diode unit coupled between the input locus and a coupling locus; and (2) providing a second diode unit coupled between the coupling locus and the respective power rail. (b) In no particular order: (1) configuring the first diode unit to effect substantially zero potential drop across the first diode unit during normal operation of the apparatus; and (2) configuring the second diode unit to present no forward bias during normal operation of the apparatus. (c) Operating the first and second diode units cooperatively to effect current flow between the input locus and the respective power rail during a predetermined operational condition of the apparatus.

It is, therefore an object of the invention to provide an apparatus and method for stringently limiting current leakage during normal operations while permitting current flow through a circuit locus, such as a terminal during an ESD condition.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
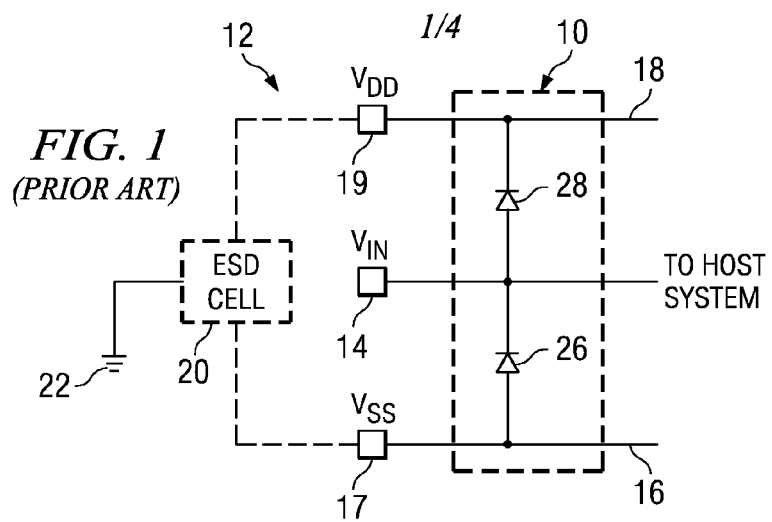
FIG. 1 is an electrical schematic diagram of a prior art leakage preventing circuit arrangement.

FIG. 1 is an electrical schematic diagram of a prior art leakage preventing circuit arrangement. In FIG. 1, a circuit 10 is employed with an input circuit 12. Input circuit 12 includes an input pin 14 for receiving an input voltage $V_{IN}$; input voltage $V_{IN}$ is provided to a host system (not shown in FIG. 1). Input circuit 12 also includes a lower voltage rail 16 coupled with a lower voltage rail pin 17 to which is applied a lower rail voltage $V_{SS}$ and an upper voltage rail 18 coupled with an upper voltage rail pin 19 to which is applied an upper rail voltage $V_{DD}$. Lower voltage rail 16 and upper voltage rail 18 may provide rail voltages $V_{SS}$, $V_{DD}$ for use by the host system (not shown in FIG. 1). Preferably lower rail voltage $V_{SS}$ is less than input voltage $V_{IN}$ and input voltage $V_{IN}$ is less than upper rail voltage $V_{DD}$. By way of example and not by way of limitation lower rail voltage $V_{SS}$ may be zero volts, input voltage $V_{IN}$ may be vary about 2 volts and upper rail voltage $V_{DD}$ may be 5 volts. An electrostatic discharge (ESD) cell 20 may be coupled with at least lower rail pin 16 and upper rail voltage pin 18 to facilitate electrostatic discharge to ground 22.

Circuit 10 includes a first diode 26 coupled for forward conduction from lower voltage rail 16 to input pin 14 and a second diode 28 coupled for forward conduction from input pin 14 to upper voltage rail 18. Each of diodes 26, 28 is reverse biased during normal operation of input circuit 12. During an ESD operation caused, for example, by a human touching one of input pin 14 or lower voltage rail pin 17, one or both of diodes 26, 28 will be forward biased so that a current path may be established via ESD cell 20 to ground 22.

There is a problem with circuit 10 because during normal operation of the host system (not shown in FIG. 1) there is a relatively high voltage imposed across diodes 26, 28 sufficient to establish leakage across one or both of diodes 26, 28. Such leakage is undesirable. It is most desired that an input circuit such as input circuit 10 cooperate with an ESD cell 20 to handle high levels of power for some operations such as ESD discharge while providing little or no leakage during normal operations.

Figure 2:
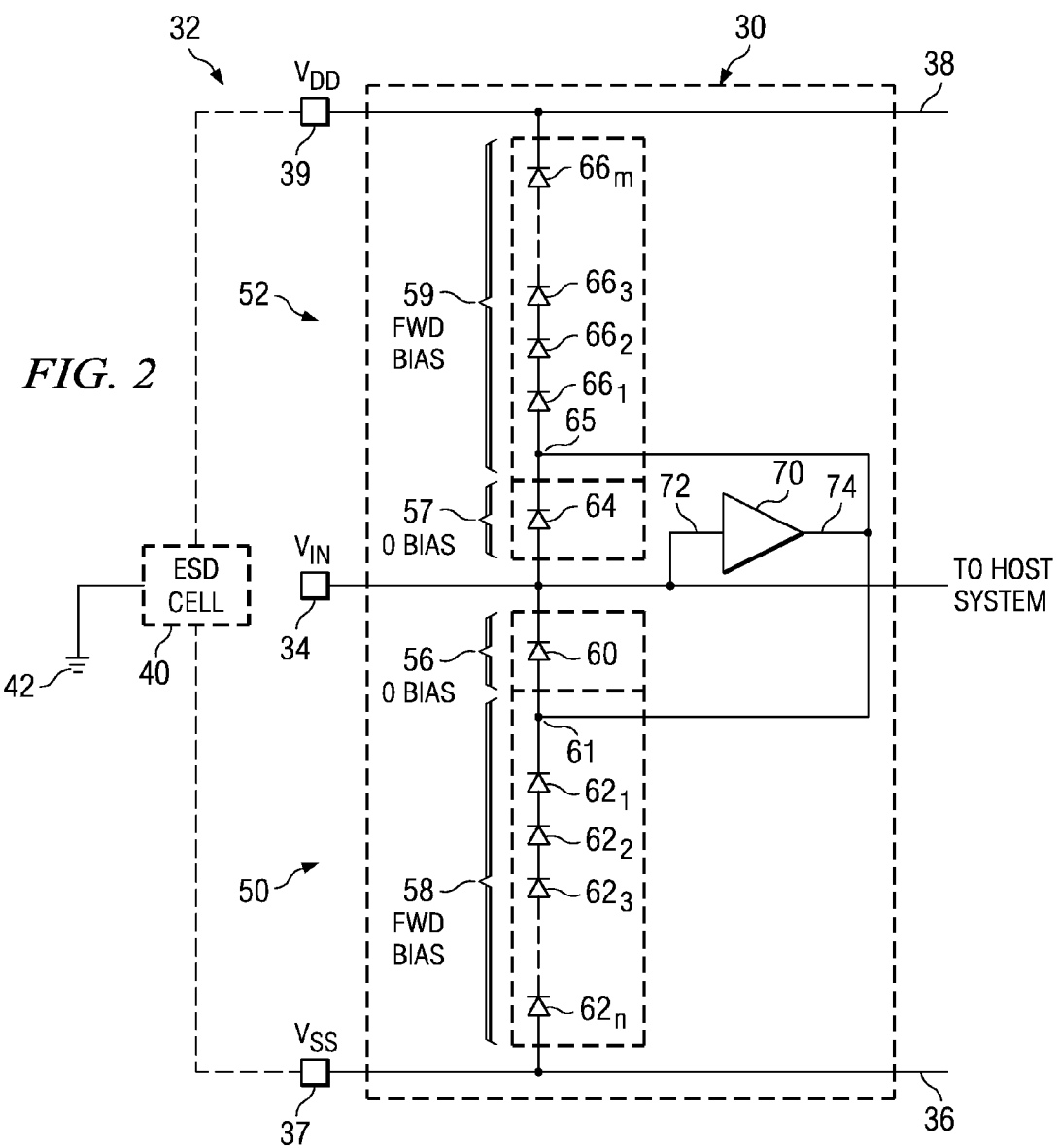
FIG. 2 is an electrical schematic diagram of a first embodiment of a leakage preventing circuit arrangement configured according to the teaching of the present invention.

FIG. 2 is an electrical schematic diagram of a first embodiment of a leakage preventing circuit arrangement configured according to the teaching of the present invention. In FIG. 2, a circuit 30 is employed with an input circuit 32. Input circuit 32 includes an input pin 34 for receiving an input voltage $V_{IN}$; input voltage $V_{IN}$ is provided to a host system (not shown in FIG. 2). Input circuit 32 also includes a lower voltage rail 36 coupled with a lower voltage rail pin 37 to which is applied a lower rail voltage $V_{SS}$ and an upper voltage rail 38 coupled with an upper voltage rail pin 39 to which is applied an upper rail voltage $V_{DD}$. Lower voltage rail 36 and upper voltage rail 38 may provide rail voltages $V_{SS}$, $V_{DD}$ for use by the host system (not shown in FIG. 2). Preferably lower rail voltage $V_{SS}$ is less than input voltage $V_{IN}$ and input voltage $V_{IN}$ is less than upper rail voltage $V_{DD}$. By way of example and not by way of limitation lower rail voltage $V_{SS}$ may be zero volts, input voltage $V_{IN}$ may be vary about 2 volts and upper rail voltage $V_{DD}$ may be 5 volts. An electrostatic discharge (ESD) cell 40 may be coupled with at least lower rail pin 36 and upper rail voltage pin 38 to facilitate discharge of electrostatic discharge to ground 42.

Circuit 30 includes a first diode group 50 coupled for forward conduction from lower voltage rail 36 to input pin 34 and a second diode group 52 coupled for forward conduction from input pin 34 to upper voltage rail 38. First diode group 50 includes a first diode unit 56 and a second diode unit 58. First diode unit 56 preferably includes a diode 60 that is coupled with input pin 34 and coupled with second diode unit 58. Diode 60 is coupled to effect substantially a zero voltage drop between input pin 34 and second diode unit 58 during normal operations of the host system (not shown in FIG. 2). Second diode unit 58 includes at least one diode $62_1$, $62_2$, $62_3$, $62_n$. Diodes $62_1$, $62_2$, $62_3$, $62_n$ preferably cooperate to establish no forward bias between lower voltage rail 36 and input pin 34 during normal operation. The indicator "n" is employed to signify that there can be any number of diodes in second diode unit 58. The inclusion of four diodes $62_1$, $62_2$, $62_3$, $62_n$ in FIG. 2 is illustrative only and does not constitute any limitation regarding the number of diodes that may be included in the present invention.

A preferred structure for effecting the desired biases for diode 60 and diodes $62_1$, $62_2$, $62_3$, $62_n$ is a buffer unit 70 having an input terminal 72 coupled with input pin 34 and an output terminal 74 coupled with a coupling terminal 61 between diode 60 and diodes $62_1$, $62_2$, $62_3$, $62_n$. Buffer unit 70 is preferably configured to present at output terminal 74 substantially the same voltage level received at input terminal 72, thereby effecting the desired substantially zero voltage drop across diode 60 and effecting the desired reverse bias across diodes $62_1$, $62_2$, $62_3$, $62_n$. Other circuit structures may be employed to effect the desired voltage drop and biases.

Second diode group 52 includes a first diode unit 57 and a second diode unit 59. First diode unit 57 preferably includes a diode 64 that is coupled with input pin 34 and coupled with second diode unit 59. Diode 64 is coupled to effect substantially a zero voltage drop between input pin 34 and second diode unit 59 during normal operations of the host system (not shown in FIG. 2). Second diode unit 59 includes at least one diode $66_1$, $66_2$, $66_3$, $66_m$. Diodes $66_1$, $66_2$, $66_3$, $66_m$ preferably cooperate to establish no forward bias between input pin 34 and upper voltage rail 38 and during normal operation. The indicator "m" is employed to signify that there can be any number of diodes in second diode unit 59. The inclusion of four diodes $62_1$, $62_2$, $62_3$, $62_m$ in FIG. 2 is illustrative only and does not constitute any limitation regarding the number of diodes that may be included in the present invention.

A preferred structure for effecting the desired biases for diode 64 and diodes $66_1$, $66_2$, $66_3$, $66_m$ is buffer unit 70 having output terminal 74 coupled with a coupling terminal 65 between diode 64 and diodes $66_1$, $66_2$, $66_3$, $66_m$. As described earlier, buffer unit 70 is preferably configured to present at output terminal 74 substantially the same voltage level received at input terminal 72, thereby effecting the desired substantially zero voltage drop across diode 64 and effecting the desired reverse bias across diodes $66_1$, $66_2$, $66_3$, $66_m$. Other circuit structures may be employed to effect the desired voltage drop and biases.

Each of diode groups 50, 52 is reverse biased during normal operation of input circuit 32. Each of diodes 60, 64 presents a substantially zero voltage drop from input pin 34 to a respective second diode unit 58, 59, thereby reducing leakage across diodes 60, 64 and thereby also reducing leakage between input pin 34 and voltage rails 36, 38. During an ESD operation caused, for example, by a human touching one of input pin 34 or lower voltage rail pin 37, one or both of diode groups 50, 52 will be forward biased so that a current path may be established via ESD cell 40 to ground 42.

Figure 3:
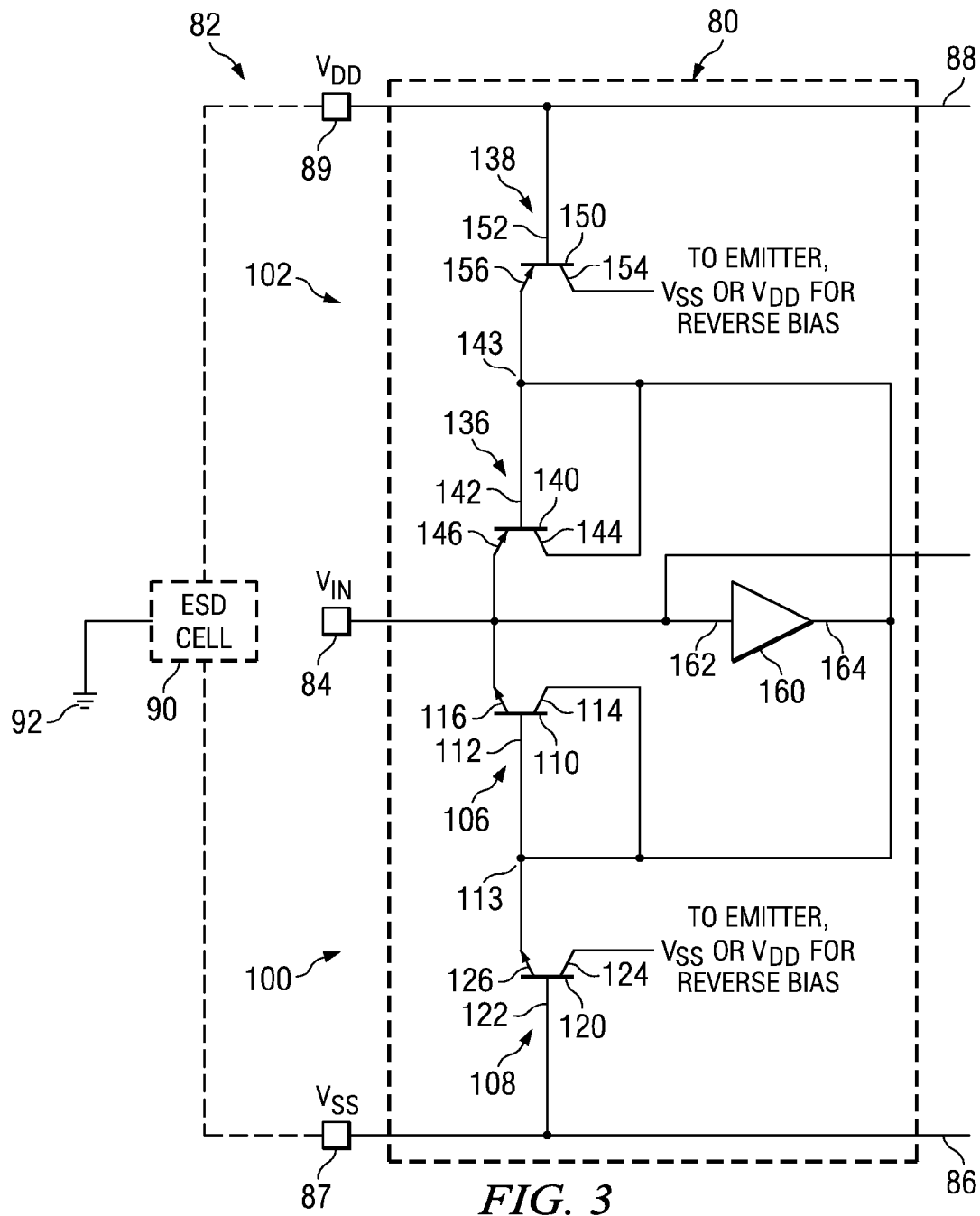
FIG. 3 is an electrical schematic diagram of a second embodiment of a leakage preventing circuit arrangement configured according to the teaching of the present invention.

FIG. 3 is an electrical schematic diagram of a second embodiment of a leakage preventing circuit arrangement configured according to the teaching of the present invention. In FIG. 3, a circuit 80 is employed with an input circuit 82. Input circuit 82 includes an input pin 84 for receiving an input voltage $V_{IN}$; input voltage $V_{IN}$ is provided to a host system (not shown in FIG. 3). Input circuit 82 also includes a lower voltage rail 86 coupled with a lower voltage rail pin 87 to which is applied a lower rail voltage $V_{SS}$ and an upper voltage rail 88 coupled with an upper voltage rail pin 89 to which is applied an upper rail voltage $V_{DD}$. Lower voltage rail 86 and upper voltage rail 88 may provide rail voltages $V_{SS}$, $V_{DD}$ for use by the host system (not shown in FIG. 3). Preferably lower rail voltage $V_{SS}$ is less than input voltage $V_{IN}$ and input voltage $V_{IN}$ is less than upper rail voltage $V_{DD}$. By way of example and not by way of limitation lower rail voltage $V_{SS}$ may be zero volts, input voltage $V_{IN}$ may be vary about 2 volts and upper rail voltage $V_{DD}$ may be 5 volts. An electrostatic discharge (ESD) cell 90 may be coupled with at least lower rail pin 86 and upper rail voltage pin 88 to facilitate discharge of electrostatic discharge to ground 92.

Circuit 80 includes first diode group 100 coupled for forward conduction from lower voltage rail 86 to input pin 84 and a second diode group 102 coupled for forward conduction from input pin 84 to upper voltage rail 88. First diode group 100 includes a first diode unit 106 and a second diode unit 108. First diode unit 106 preferably includes a diode-connected bipolar transistor 110 having a base 112, a collector 114 and an emitter 116. Emitter 116 is coupled with input pin 84. Collector 114 is coupled with base 112, thereby effecting diode-connection for transistor 110. Base 112 is also coupled with second diode unit 108. Second diode unit 108 preferably includes a diode-connected bipolar transistor 120 having a base 122, a collector 124 and an emitter 126. Emitter 126 is coupled with base 112 of transistor 110. Base 122 is coupled with lower voltage rail 86. Connection of collector 114 may be established by a designer skilled in the art of circuit design to lower voltage rail 86, or to upper voltage rail 88 or to emitter 126 as appropriate to effect diode-connection for transistor 120 and achieve a desired leakage characteristic.

Second diode group 102 includes a first diode unit 136 and a second diode unit 138. First diode unit 136 preferably includes a diode-connected bipolar transistor 140 having a base 142, a collector 144 and an emitter 146. Emitter 146 is coupled with input pin 84. Collector 144 is coupled with base 142, thereby effecting diode-connection for transistor 140. Base 142 is also coupled with second diode unit 138. Second diode unit 138 preferably includes a diode-connected bipolar transistor 150 having a base 152, a collector 154 and an emitter 156. Emitter 156 is coupled with base 142 of transistor 140. Base 152 is coupled with upper voltage rail 88. Connection of collector 154 may be established by a designer skilled in the art of circuit design to lower voltage rail 86, or to upper voltage rail 88 or to emitter 156 as appropriate to effect diode-connection for transistor 150 and achieve a desired leakage characteristic.

First diode unit 106 is coupled to effect substantially a zero voltage drop between input pin 84 and second diode unit 108 during normal operations of the host system (not shown in FIG. 3). Second diode unit 108 preferably establishes no forward bias between lower voltage rail 86 and input pin 84 during normal operation. First diode unit 136 is coupled to effect substantially a zero voltage drop between input pin 84 and second diode unit 138 during normal operations of the host system (not shown in FIG. 3). Second diode unit 138 preferably establishes no forward bias between input pin 84 and upper voltage rail 88 during normal operation.

A buffer unit 160 has an input terminal 162 coupled with input pin 84 and an output terminal 164. Output terminal 164 is coupled with a coupling terminal 113 between diode units 106, 108 and coupled with a coupling terminal 143 between diode units 136, 138. Buffer unit 160 is preferably configured to present at output terminal 164 substantially the same voltage level received at input terminal 162, thereby effecting the desired substantially zero voltage drop across diode unit 106 and across diode unit 136. Connecting output terminal 164 with coupling loci 113, 143 also effects the desired reverse bias across diode units 108, 138. Other circuit structures may be employed to effect the desired voltage drop and biases.

Each of diode groups 100, 102 is reverse biased during normal operation of input circuit 82. Each of diode units 106, 136 presents a substantially zero voltage drop from input pin 84 to a respective second diode unit 108, 138, thereby reducing leakage across diode units 106, 136 and thereby reducing leakage between input pin 84 and voltage rails 86, 88. During an ESD operation caused, for example, by a human touching one of input pin 84 or lower voltage rail pin 87, one or both of diode groups 100, 102 will be forward biased so that a current path may be established via ESD cell 90 to ground 92.

Figure 4:
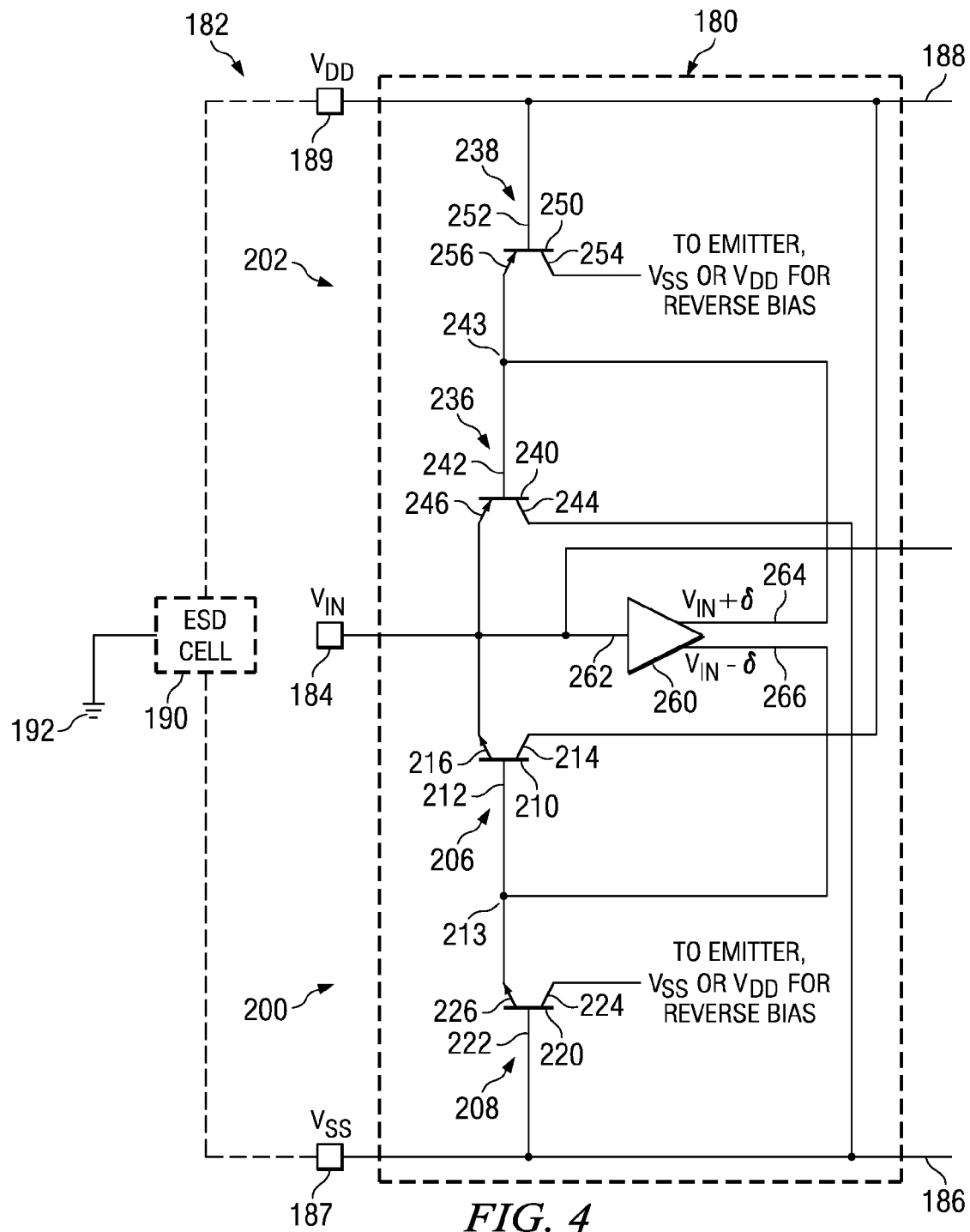
FIG. 4 is an electrical schematic diagram of a third embodiment of a leakage preventing circuit arrangement configured according to the teaching of the present invention.

FIG. 4 is an electrical schematic diagram of a third embodiment of a leakage preventing circuit arrangement configured according to the teaching of the present invention. In FIG. 4, a circuit 180 is employed with an input circuit 182. Input circuit 182 includes an input pin 184 for receiving an input voltage $V_{IN}$; input voltage $V_{IN}$ is provided to a host system (not shown in FIG. 4). Input circuit 182 also includes a lower voltage rail 186 coupled with a lower voltage rail pin 187 to which is applied a lower rail voltage $V_{SS}$ and an upper voltage rail 188 coupled with an upper voltage rail pin 189 to which is applied an upper rail voltage $V_{DD}$. Lower voltage rail 186 and upper voltage rail 188 may provide rail voltages $V_{SS}$, $V_{DD}$ for use by the host system (not shown in FIG. 4). Preferably lower rail voltage $V_{SS}$ is less than input voltage $V_{IN}$ and input voltage $V_{IN}$ is less than upper rail voltage $V_{DD}$. By way of example and not by way of limitation lower rail voltage $V_{SS}$ may be zero volts, input voltage $V_{IN}$ may be vary about 2 volts and upper rail voltage $V_{DD}$ may be 5 volts. An electrostatic discharge (ESD) cell 190 may be coupled with at least lower rail pin 186 and upper rail voltage pin 188 to facilitate discharge of electrostatic discharge to ground 192.

Circuit 180 includes first diode group 200 coupled for forward conduction from lower voltage rail 186 to input pin 184 and a second diode group 202 coupled for forward conduction from input pin 184 to upper voltage rail 188. First diode group 200 includes a first diode unit 206 and a second diode unit 208. First diode unit 206 preferably includes a diode-connected bipolar transistor 210 having a base 212, a collector 214 and an emitter 216. Emitter 216 is coupled with input pin 184. Collector 214 is coupled with upper voltage rail 188 to establish a hard reverse bias for first bipolar transistor 210. For a slight emitter-base reverse bias (but greater than kT), emitter leakage is minimized with the large bias by preventing carrier emission from the collector. Base 212 is coupled with second diode unit 208. Second diode unit 208 preferably includes a diode-connected bipolar transistor 220 having a base 222, a collector 224 and an emitter 226. Emitter 226 is coupled with base 212 of transistor 210. Base 222 is coupled with lower voltage rail 186. Connection of collector 214 may be established by a designer skilled in the art of circuit design to lower voltage rail 186 or to upper voltage rail 188 or to emitter 226 as appropriate to effect diode-connection for transistor 220 and achieve a desired leakage characteristic.

Second diode group 202 includes a first diode unit 236 and a second diode unit 238. First diode unit 236 preferably includes a diode-connected bipolar transistor 240 having a base 242, a collector 244 and an emitter 246. Emitter 246 is coupled with input pin 184. Collector 244 is coupled with lower voltage rail 186 to establish a hard reverse bias for first bipolar transistor 240. For a slight emitter-base reverse bias (but greater than kT), emitter leakage is minimized with the large bias by preventing carrier emission from the collector. Base 242 is coupled with second diode unit 238. Second diode unit 238 preferably includes a diode-connected bipolar transistor 250 having a base 252, a collector 254 and an emitter 256. Emitter 256 is coupled with base 242 of transistor 240. Base 252 is coupled with upper voltage rail 188. Connection of collector 254 may be established by a designer skilled in the art of circuit design to lower voltage rail 186 or to upper voltage rail 188 or to emitter 256 as appropriate to effect diode-connection for transistor 250 and achieve a desired leakage characteristic.

First diode unit 206 is coupled to effect substantially a zero voltage drop between input pin 184 and second diode unit 208 during normal operations of the host system (not shown in FIG. 4). Second diode unit 208 preferably establishes no forward bias between lower voltage rail 186 and input pin 184 during normal operation. First diode unit 236 is coupled to effect substantially a zero voltage drop between input pin 184 and second diode unit 238 during normal operations of the host system (not shown in FIG. 4). Second diode unit 238 preferably establishes no forward bias between input pin 184 and upper voltage rail 188 during normal operation.

A buffer unit 260 has an input terminal 262 coupled with input pin 184 and output loci 264, 266. Buffer unit 260 is preferably configured to present at output terminal 264 substantially the same voltage level received at input terminal 262, plus a differential voltage amount δ. Buffer unit 260 is also preferably configured to present at output terminal 266 substantially the same voltage level received at input terminal 262, minus differential voltage amount δ. Buffer unit 260 operates as a dual output offset buffer, presenting at output signals at loci 264, 266 output signals that are offset from input signals received at input terminal 262 by a small amount for biasing diode units 206, 208, 236, 238. By way of example and not by way of limitation, the voltage output offset value δ may be selected to be on the order of a few thermal voltages (kT). Thermal voltages kT are known to those skilled in the art of circuit design as a temperature-related factor involved with diode design. By way of further example and not by way of limitation, one thermal voltage kT is about 0.026 volt at room temperature; one thermal voltage kT is about 0.04 volt at high operating temperature (e.g., 150 Degrees Centigrade) for an electrical circuit.

Connecting output terminal 264 with coupling terminal 243 effects the desired substantially zero voltage drop across diode unit 236 and effects the desired reverse bias across diode unit 238. Connecting output terminal 266 with coupling terminal 213 effects the desired substantially zero voltage drop across diode unit 206 and effects the desired reverse bias across diode unit 208.

Employing buffer unit 260 embodied in a dual output offset buffer permits less-stringent tolerances in voltage offsets permitted in circuit components for effecting operational amplifier operations, such as operating buffer unit 260. Less-stringent tolerances permit less expensive circuit devices, such as buffer unit 260, permit smaller circuit layout requirements (i.e., less "real estate" or die space for effecting the circuit) and permit lower input capacitance for circuit 180 (FIG. 4) than may be presented by circuit 80 (FIG. 3). Other circuit structures than a dual output offset buffer may be employed to effect the desired voltage drop and biases.

Each of diode groups 200, 202 is reverse biased during normal operation of input circuit 182. Each of diode units 206, 236 presents a substantially zero voltage drop from input pin 184 to a respective second diode unit 208, 238, thereby reducing leakage across diode units 206, 236 and thereby reducing leakage between input pin 184 and voltage rails 186, 188. During an ESD operation caused, for example, by a human touching one of input pin 184 or lower voltage rail pin 187, one or both of diode groups 200, 202 will be forward biased so that a current path may be established via ESD cell 190 to ground 192.

Figure 5:
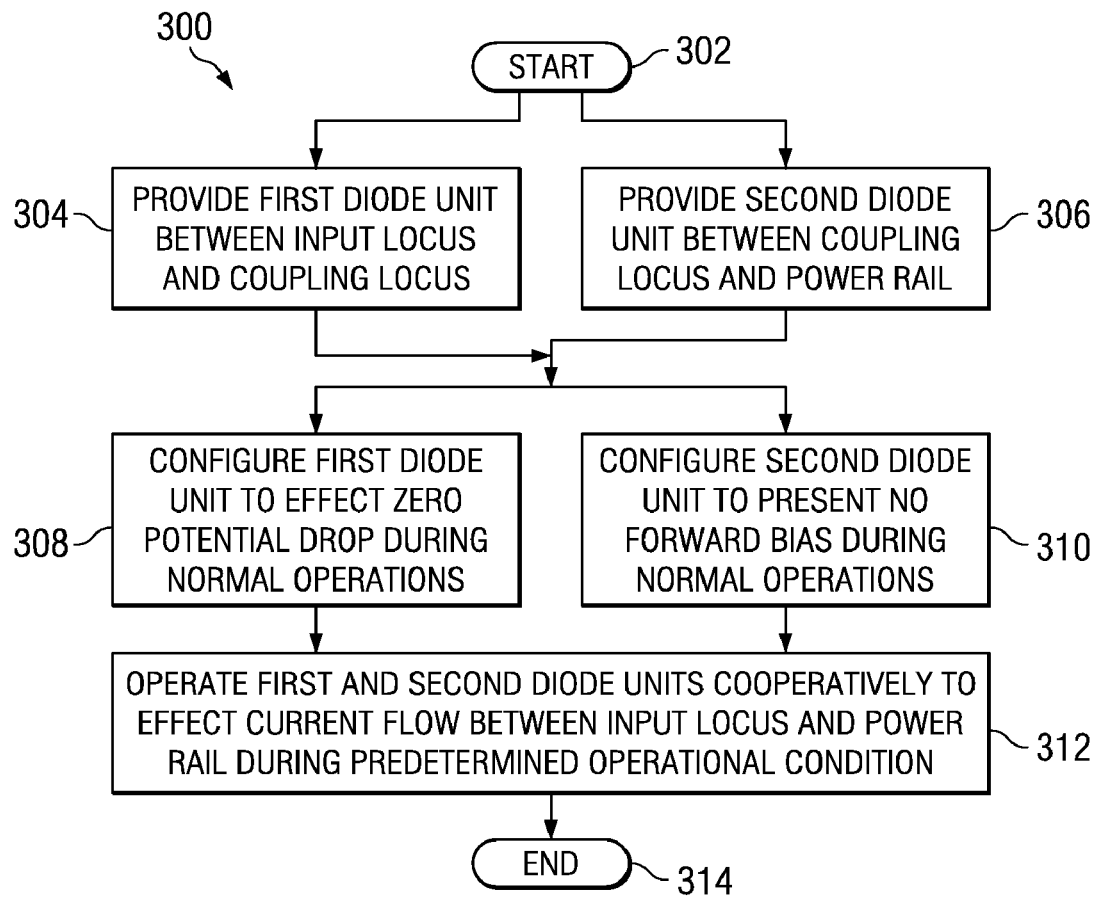
FIG. 5 is a flow diagram illustrating the method of the present invention.

FIG. 5 is a flow diagram illustrating the method of the present invention. In FIG. 5, a method 300 for reducing current leakage between an input locus and at least one power rail for a system begins at a START locus 302. Method 300 includes, for each respective selected power rail of the at least one power rail, the steps of: (a) In no particular order: (1) providing a first diode unit coupled between the input locus and a coupling locus, as indicated by a block 304; and (2) providing a second diode unit coupled between the coupling locus and the respective selected power rail, as indicated by a block 306. Method 300 continues with (b) in no particular order: (1) configuring the first diode unit to effect substantially zero potential drop across the first diode unit during normal operation of the circuit, as indicated by a block 308; and (2) configuring the second diode unit to present no forward bias during normal operation of the circuit, as indicated by a block 310. Method 300 continues by (c) operating the first and second diode units cooperatively to effect current flow between the input locus and the respective power rail during a predetermined operational condition of the circuit, as indicated by a block 312. Method 300 terminates at an END locus 314.

It is to be understood that, while the detailed drawings and specific examples given describe preferred embodiments of the invention, they are for the purpose of illustration only, that the circuit and method of the invention are not limited to the precise details and conditions disclosed and that various changes may be made therein without departing from the spirit of the invention which is defined by the following claims:

We claim:

1. An apparatus comprising:
    a first voltage rail;
    a second voltage rail;
    an input node that is adapted to receive an input voltage;
    a first diode-connected transistor that is coupled to the input node at its emitter;
    a first bias transistor that is coupled to the first voltage rail at its base and to the base of the first diode-connected transistor at its emitter;
    a second diode-connected transistor that is coupled to the input node at its emitter;
    a second bias transistor that is coupled to the second voltage rail at its base and to the base of the second diode-connected transistor at its emitter; and
    a buffer that is coupled between the input node and the bases of the first and second diode-connected transistors.

2. An apparatus comprising:
    a first voltage rail;
    a second voltage rail;
    an input node that is adapted to receive an input voltage;
    a first transistor that is coupled to the input node at its emitter and to the second voltage rail at its collector;
    a second transistor that is coupled to the first voltage rail at its base and to the base of the first transistor at its emitter;
    a third transistor that is coupled to the input node at its emitter and to the first voltage rail at its collector;
    a fourth transistor that is coupled to the second voltage rail at its base and to the base of the third transistor at its emitter; and
    a buffer that is coupled between the input node and the bases of the first and third transistors.

3. The apparatus of claim 2, wherein the buffer includes a differential output, wherein each output is coupled to at least one of the bases of the first and third transistors.

* * * * *

UNITED STATES PATENT AND TRADEMARK OFFICE
CERTIFICATE OF CORRECTION

PATENT NO. : 7,639,463 B2  Page 1 of 1
APPLICATION NO. : 11/257839
DATED : December 29, 2009
INVENTOR(S) : Steinhoff et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 887 days.

Signed and Sealed this

Twenty-first Day of December, 2010

David J. Kappos
*Director of the United States Patent and Trademark Office*